(12) United States Patent
Ladebeck

(10) Patent No.: US 8,103,330 B2
(45) Date of Patent: Jan. 24, 2012

(54) SENSOR DEVICE FOR OPERATION IN A TIME-VARYING MAGNETIC FIELD AND METHOD

(75) Inventor: Ralf Ladebeck, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1229 days.

(21) Appl. No.: 11/808,655

(22) Filed: Jun. 12, 2007

(65) Prior Publication Data
US 2008/0027308 A1  Jan. 31, 2008

(30) Foreign Application Priority Data
Jun. 13, 2006  (DE) .......................... 10 2006 027 417

(51) Int. Cl.
*A61B 5/05* (2006.01)

(52) U.S. Cl. ........ 600/411; 600/410; 600/425; 600/427; 324/318

(58) Field of Classification Search ........................ None
See application file for complete search history.

(56) References Cited

U.S. PATENT DOCUMENTS

| | | | | |
|---|---|---|---|---|
| 4,939,464 A * | 7/1990 | Hammer | ........................ | 324/318 |
| 6,946,841 B2 * | 9/2005 | Rubashov | ........................ | 324/318 |
| 7,218,112 B2 * | 5/2007 | Ladebeck et al. | ................ | 324/318 |
| 7,286,867 B2 * | 10/2007 | Schlyer et al. | ................ | 600/407 |
| 7,323,874 B2 * | 1/2008 | Krieg et al. | ................ | 324/318 |
| 7,522,952 B2 * | 4/2009 | Krieg et al. | ................ | 600/411 |
| 7,626,389 B2 * | 12/2009 | Fiedler et al. | ................ | 324/309 |
| 7,667,457 B2 * | 2/2010 | Linz et al. | ................ | 324/307 |
| 7,719,277 B2 * | 5/2010 | Eberler et al. | ................ | 324/318 |
| 7,728,590 B2 * | 6/2010 | Eberler et al. | ................ | 324/318 |
| 7,835,782 B2 * | 11/2010 | Cherry et al. | ................ | 600/411 |
| 7,847,552 B2 * | 12/2010 | Haworth et al. | ................ | 324/318 |
| 8,013,607 B2 * | 9/2011 | DeMeester et al. | ........... | 324/318 |
| 2005/0113667 A1 * | 5/2005 | Schlyer et al. | ................ | 600/411 |
| 2008/0265887 A1 * | 10/2008 | Linz et al. | ................ | 324/318 |

FOREIGN PATENT DOCUMENTS

| | | |
|---|---|---|
| DE | 89 07 501 | 2/1991 |
| WO | WO 90/11515 | 10/1990 |

OTHER PUBLICATIONS

Markus Schwaiger et al. "MR-PET: Combining Function, Anatomy, and More", Medical Solutions/Special Molecular Imaging, Siemens AG, Sep. 2005, pp. 25-30.
Schwalger, Markus et al., *MR-PET Combining Function, Anatomy, and More*, Medical Solutions Special Edition, Germany, 2005.

* cited by examiner

*Primary Examiner* — Unsu Jung
*Assistant Examiner* — Bradley Impink
(74) *Attorney, Agent, or Firm* — Harness, Dickey & Pierce, P.L.C.

(57) ABSTRACT

A sensor device, in particular a PET detector, for operation in the time-varying magnetic field of a magnetic resonance tomograph. In at least one embodiment, a sensor circuit is for generating a sensor signal, as well as an induction circuit in which a compensation signal is induced. These signals are combined with one another so as to compensate for noise signals in the sensor signal, which are induced in the sensor circuit by the time-varying magnetic field. The invention furthermore concerns a method of compensating for such noise signals.

9 Claims, 1 Drawing Sheet

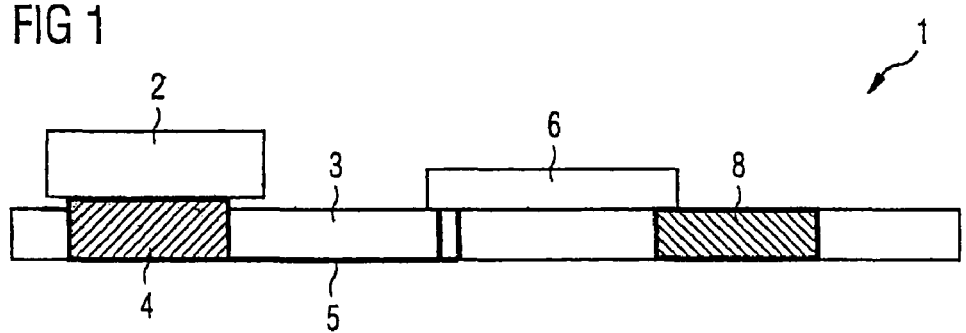
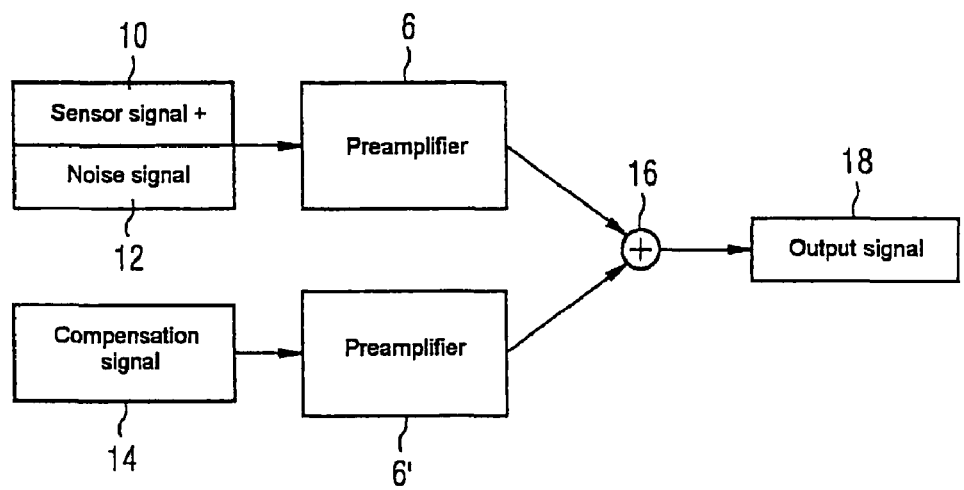

SENSOR DEVICE FOR OPERATION IN A TIME-VARYING MAGNETIC FIELD AND METHOD

PRIORITY STATEMENT

The present application hereby claims priority under 35 U.S.C. §119 on German patent application number DE 10 2006 027 417.2 filed Jun. 13, 2006, the entire contents of which is hereby incorporated herein by reference.

FIELD

Embodiments of the invention generally relate to a sensor device, such as one for operation in the time-varying magnetic field of a magnetic resonance tomograph for example, and/or to a method of compensating for noise signals.

BACKGROUND

Magnetic resonance tomography (MR or MRT) is an imaging method for the representation of tissue in the human or animal body. MRT is based on the principle of nuclear spin resonance according to which atomic nuclei, for example the hydrogen nuclei present in large numbers in the body, have a magnetic moment. These can therefore be excited with electromagnetic radiation of a particular frequency (resonant frequency) in an applied external magnetic field and they emit this radiation shortly afterwards.

In MRT, this electromagnetic radiation is detected as a signal. The resonant frequency of the atomic nuclei is directly proportional to the applied external magnetic field. Position encoding inside an image volume is therefore achieved by applying so-called gradient fields in addition to the basic magnetic field during the measurement; these are briefly applied magnetic fields with a maximally linear gradient in the X, Y or Z direction. The gradient fields are usually generated by particular gradient coils, which are arranged inside a superconducting magnet that generates the basic magnetic field.

Another medical imaging method is positron emission tomography (PET). PET is used in particular for the representation of physiological and biochemical processes inside the body. The patient is administered a tracer with a radionuclide, which becomes distributed in the body while emitting radioactive radiation. Positron radiators are used as tracers in PET, and these emit positrons which decay into two opposite gamma quanta in the body. These gamma quanta are measured by suitable detectors, which are arranged distributed around the body. For example, the photons are collected by a matrix of scintillation crystals in which the arrival of each photon generates a light flash. These are in turn collected and amplified by photodetectors, for example photomultiplier tubes or avalanche photodiodes. Preamplification of the signals follows after each detector.

Very recently, there has been interest in combining MRT and PET in one device. The PET detectors should in this case be arranged inside an MR magnet. Examples of this are described, for example, in the article by Markus Schwaiger et al. "MR-PET: Combining Function, Anatomy, and More" Medical Solutions/Special Molecular Imaging, Siemens AG, September 2005, the entire contents of which are hereby incorporated herein by reference.

For the integration of a PET scanner in an MR device, it is currently planned to use semiconductor light sensors as PET detectors, which are arranged together with a preamplifier inside the magnet. The preamplified signal is then fed out from the magnet for further processing. This, however, entails the problem that the electrical circuits arranged in the magnet are exposed not only to the constant magnetic field but also to the time-varying magnetic fields, for example the gradient fields described above. A voltage is therefore induced in the circuits belonging to the sensor and possibly the preamplifier, which voltage generates noise signals. In particular the input circuit for the preamplifier is particularly critical in this case, since all noise signals received here are co-amplified.

SUMMARY

In at least one embodiment of the invention, a sensor device is provided which is suitable for operation in the time-varying magnetic field of a magnetic resonance tomograph; as well as to provide a corresponding method of compensating for noise signals thereby generated.

The sensor device according to at least one embodiment of the invention contains an electrical sensor circuit for generating a sensor signal and in addition at least one induction circuit in which a voltage, which will be referred to as the "compensation signal", is induced by the time-varying magnetic field during operation of the magnetic resonance tomograph. A circuit arrangement is furthermore provided, by which the compensation signal can be combined with the sensor signal in order to form an output signal, so as to compensate for noise signals which are induced in the sensor circuit by the time-varying magnetic field. It is thus proposed that the voltages induced in the sensor circuit, i.e. the useful circuit, should be replicated in a further induction circuit so as then to subtract the signals collected by this circuit from the useful signal or in another suitable way to minimize the noise signal induced by the gradient fields. This additional induction circuit should preferably enclose the same flux density as the useful circuit, or sensor circuit, when the gradient fields are switched on.

Such a sensor device is particularly preferably part of a PET detector. The sensor device particularly preferably also contains at least one preamplifier for amplifying the sensor signal and the compensation signal. The preamplifier may be arranged inside the magnet of the MR device, like the sensor circuit, although an arrangement outside the magnet is also conceivable.

The circuit arrangement, which combines the sensor signal and the compensation signal with one another, is preferably an addition circuit or subtraction circuit. The circuit arrangement is particularly preferably arranged behind the preamplifier. As an alternative, however, the sensor signal and the compensation signal may already be combined with one another before the preamplifier.

The induction circuit preferably includes at least one conductor loop, also referred to as an induction loop.

Since the time-varying magnetic field has the nature of a vector, three mutually orthogonal induction loops which may be adapted to any undesired induction in a sensor circuit by individual adaptation of the position, alignment, gain, and by subsequent addition of the three individual signals, are preferably used inside the induction circuit.

At least one embodiment of the invention is particularly advantageous when the field of the gradient coils which causes noise is homogeneous in the region of the sensor circuit. The induction circuit is therefore preferably arranged in spatial proximity to the associated sensor circuit.

A plurality of sensor circuits are preferably provided, as is necessary for a PET detector, an induction circuit being provided for each sensor circuit.

As an alternative, however, one induction circuit may be used in order to correct the signals of a plurality of sensor circuits. This is feasible in particular when it is known that the gradient fields at the position of the induction coil are respectively greater or smaller by a particular factor or have a different direction than at the positions of the sensor circuits. In this case the compensation signal may respectively be multiplied by a suitable factor, and only thereafter combined by addition or subtraction with the sensor signals. In this way, a basic setting of the compensation can be adapted individually according to the installation position of the sensor circuit in the gradient coil.

According to a particular example embodiment of the PET detector, the signals of N photosensors are summed in a weighted fashion so that only M<N output signals are generated. This is referred to as multiplexing. It offers the possibility of adding the undesired induction voltages to one another in the layout so that the noise signals cancel out one another. This saves on additional induction circuits and therefore space on the printed circuit board, preamplifier and circuit arrangements for the weighting circuits.

If a plurality of induction circuits are used for a plurality of sensor circuits, then the size and alignment of the respective induction loops of the induction circuits are preferably adapted to the installation position inside the magnet. This is expedient because the position of the sensor circuits relative to the gradient coils is different, and the fields therefore have different directions and a different size at various positions. Also adapting the induction circuits in terms of direction and size to the position simplifies combination of the compensation signals with the sensor signals; weighting of the compensation signals with a particular factor before the addition may optionally be avoided.

At least one embodiment of the invention also relates to a method of compensating for noise signals which are induced in a sensor circuit by a time-varying magnetic field of a magnetic resonance tomograph. The method includes the following steps: providing an induction circuit in which a compensation signal is induced by the time-varying magnetic field during operation of the magnetic resonance tomograph; combining the compensation signal with the sensor signal of the sensor circuit, so that the noise signals and the compensation signal cancel out one another as much as possible; and outputting the combined signal as an output signal. The sensor signal and the compensation signal are particularly preferably not combined until after both signals have been preamplified.

The method may be configured according to the features described above in connection with the sensor device.

BRIEF DESCRIPTION OF THE DRAWINGS

The invention will now be explained in more detail with the aid of example embodiments with reference to the appended drawings. In the drawings:

FIG. 1 shows a schematic cross section through a sensor device according to an example embodiment of the invention;

FIG. 2 shows a flow chart of the signal processing according to an example embodiment of the invention.

DETAILED DESCRIPTION OF THE EXAMPLE EMBODIMENTS

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described. Like numbers refer to like elements throughout. As used herein, the terms "and/or" and "at least one of" include any and all combinations of one or more of the associated listed items.

FIG. 1 shows a sensor device 1 having a photosensor 2, for example a semiconductor detector such as an avalanche photodiode, which is arranged on a printed circuit board 3. The photosensor 2 is connected via the conductor 5 to a preamplifier 6, which is likewise arranged on the printed circuit board 3. This provides a sensor circuit 4 in the region of the photosensor 2. Since this circuit 4 has a certain area and therefore encloses a certain magnetic flux density when the gradients are switched on, it includes the induction surface shown by shading on the left. The induction surface shown by shading is the area over which a noise signal is induced. This is transmitted via the conductor 5 to the preamplifier, where it is amplified.

In order to compensate for these noise signals, a further induction loop 8 (represented by shading on the right in the drawing) is provided inside the printed circuit board 3. If a homogeneous time-varying magnetic field can be assumed to a first approximation, then this conductor loop is preferably aligned approximately in the same way and has the same area as the induction loop of the sensor circuit 4. If the gradient field at the position of the induction loop 8 is known to be always greater or less than at the sensor circuit 4, then this can be taken into account by adapting the size and alignment of the induction circuit 8.

FIG. 2 shows the signal processing: The noise signal 12 collected in the induction loop 4 is superimposed on the sensor signal 10 generated by the photosensor 2, and the latter is thus fed into a first preamplifier 6. The compensation signal 14 collected by the induction circuit 8 is fed into a second preamplifier 6'. The preamplifiers 6, 6' respectively have a bandwidth=x and a gain, which is for example v in the case of the preamplifier 6. The gain of the preamplifier 6' is then $-1 \cdot v/\alpha$, where $\alpha$ is the difference between the voltages induced in the sensor circuit 4 and in the induction circuit 8. The compensation signal 14 thus differs approximately by a factor of $\alpha$ from the noise signal 12. The factor $\alpha$ characterizes the different positions and different strengths and directions of the gradient field between the sensor circuit 4 and the induction circuit 8.

If the gains of the preamplifiers 6, 6' were adjusted according to the received signals, then these would merely need to be added to one another in the summator 16 in order to deliver the output signal 18. As an alternative, the summator 16 may also be a more complicated weighting circuit which can perform an arbitrary combination of the signals of the preamplifiers 6 and 6'; for example, it may arbitrarily weight and add or subtract the two signals.

If the sensor signals from a plurality of photosensors are combined by means of multiplexing according to the preferred embodiment, the signals of N photosensors being transmitted on a number M<N of output lines, then under certain circumstances compensation for the noise signals can already be achieved thereby. In this case, the induction circuit defined in claim 1 would merely be a further sensor circuit, the sensor signal of which is expediently combined with the signal of the sensor circuit mentioned first so that the respective noise signals cancel out one another. The invention therefore makes it possible to measure noise-free PET signals, even though the MR gradients are switched on during this.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program and computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a computer readable media and is adapted to perform any one of the aforementioned methods when run on a computer device (a device including a processor). Thus, the storage medium or computer readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDS; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A Positron Emission Tomography (PET) detector including a sensor device, the sensor device configured to operate in a time-varying magnetic field of a magnetic resonance tomograph, the sensor device comprising:
    an electrical sensor circuit configured to generate a sensor signal;
    an induction circuit in which a compensation signal is induced by the lime-varying magnetic field during operation of the magnetic resonance tomograph; and
    a circuit arrangement configured to combine the compensation signal with the sensor signal to form an output signal to compensate for noise signals induced in the at least one electrical sensor circuit by the lime-varying magnetic field, wherein
        the sensor device further includes N photosensors respectively outputting N sensor signals, the sensor signal output by the electrical sensor circuit being a portion of the N sensor signals, the N sensor signals being transmitted on M output lines, the M output lines being less than the N photosensors, and
        the sensor signal of each photosensor is added to each output line and is weighted with a predetermined factor before the addition.

2. The PET detector of claim 1, wherein the sensor device further comprises at least one preamplifier for amplifying the sensor signal and the compensation signal.

3. The PET detector as claimed in claim 1, wherein the circuit arrangement is configured to at least one of subtract a preamplified compensation signal from a preamplified sensor signal and add the preamplified compensation signal from the preamplified sensor signal.

4. The PET detector as claimed in claim 1, wherein the induction circuit comprises three mutually orthogonal loops.

5. The PET detector as claimed in claim 1, wherein said electrical sensor circuit includes a plurality of electrical sensor circuits and at least one of said induction circuit is provided for each of the plurality of electrical sensor circuits.

6. The PET detector of claim 1, wherein each induction circuit is arranged in spatial proximity to an associated electrical sensor circuit.

7. The PET detector of claim 1, wherein said electrical sensor circuit includes a plurality of electrical sensor circuits and at least one of said induction circuit is provided for each of the plurality of electrical sensor circuits, the sensor signal of each of the plurality of electrical sensor circuits being added to the sensor signals of the other electrical sensor circuits and being weighted with a predetermined factor before the addition, so that the noise signals on the sensor signals cancel out one another.

8. A method of compensating for noise signals induced in an electrical sensor circuit of a sensor device by a time-varying magnetic field of a magnetic resonance tomograph, the electrical sensor circuit configured to generate a sensor signal and the sensor device including N photosensors, the method comprising:

inducing a compensation signal in an induction circuit by the time-varying magnetic field during operation of the magnetic resonance tomograph;

combining the compensation signal with the sensor signal of the electrical sensor circuit, so that the noise signals and the compensation signal cancel out one another; and outputting the combined signal as an output signal, wherein the N photosensors respectively output N sensor signals, the sensor signal output by the electrical sensor circuit is a portion of the N sensor signals, the N sensor signals are transmitted on M output lines, the M output lines being less than the N photosensors, and the sensor signal of each photosensor is added to each output line and is weighted with a predetermined factor before the addition.

9. The method as claimed in claim 8, wherein the sensor signal and the compensation signal are not combined until after both signals have been preamplified.

* * * * *